United States Patent
Mizuguchi et al.

(10) Patent No.: US 10,048,583 B2
(45) Date of Patent: Aug. 14, 2018

(54) METHOD FOR MANUFACTURING CONDUCTIVE PATTERN FORMING MEMBER

(71) Applicant: TORAY INDUSTRIES, INC., Tokyo (JP)

(72) Inventors: Tsukuru Mizuguchi, Otsu (JP); Tomotaka Kawano, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/684,469

(22) Filed: Aug. 23, 2017

(65) Prior Publication Data

US 2017/0363956 A1 Dec. 21, 2017

Related U.S. Application Data

(63) Continuation of application No. PCT/JP2016/062150, filed on Apr. 15, 2016.

(30) Foreign Application Priority Data

Apr. 21, 2015 (JP) ................. 2015-086437

(51) Int. Cl.
| | |
|---|---|
| G03F 7/20 | (2006.01) |
| G03F 7/004 | (2006.01) |
| C08F 220/12 | (2006.01) |
| C08F 220/06 | (2006.01) |
| C08F 222/20 | (2006.01) |
| G03F 7/11 | (2006.01) |
| G03F 7/038 | (2006.01) |
| G03F 7/16 | (2006.01) |
| G03F 7/26 | (2006.01) |
| G06F 3/044 | (2006.01) |

(52) U.S. Cl.
CPC .......... *G03F 7/0047* (2013.01); *C08F 220/06* (2013.01); *C08F 220/12* (2013.01); *C08F 222/20* (2013.01); *G03F 7/038* (2013.01); *G03F 7/11* (2013.01); *G03F 7/16* (2013.01); *G03F 7/20* (2013.01); *G03F 7/26* (2013.01); *G06F 3/044* (2013.01); *G06F 2203/04103* (2013.01)

(58) Field of Classification Search
CPC ........ G03F 7/004; G03F 7/0047; G03F 7/027; G03F 7/038; G03F 7/0388; G03F 7/11; G03F 7/20; G03F 7/40; G06F 3/044; G06F 2203/04103
USPC .............. 430/281, 287.1, 319, 321
See application file for complete search history.

(56) References Cited

U.S. PATENT DOCUMENTS

| | | | | |
|---|---|---|---|---|
| 2005/0287472 | A1* | 12/2005 | Lee ................ | G03F 7/0007 430/270.1 |
| 2010/0260986 | A1* | 10/2010 | Ito ................... | G06F 3/045 428/212 |
| 2012/0172484 | A1 | 7/2012 | Kim et al. | |
| 2013/0133933 | A1 | 5/2013 | Tsuno et al. | |
| 2015/0248053 | A1* | 9/2015 | Tanabe ............ | H01B 1/22 345/174 |

FOREIGN PATENT DOCUMENTS

| | | |
|---|---|---|
| CN | 102365690 A | 2/2012 |
| CN | 102585713 A | 7/2012 |
| CN | 103354105 A | 10/2013 |
| JP | 5364787 B2 | 9/2013 |
| JP | 2015-184626 A | 10/2015 |
| JP | 2015-184648 A | 10/2015 |
| JP | 2016-46031 A | 4/2016 |
| JP | 2016-97595 A | 5/2016 |
| WO | WO 2010/113287 A1 | 10/2010 |
| WO | WO 2013/118875 A1 | 8/2013 |

OTHER PUBLICATIONS

Written Opinion of the International Searching Authority for PCT/JP2016/062150 (PCT/ISA/237) dated Jul. 19, 2016 (with English Translation).
International Search Report for PCT/JP2016/062150 (PCT/ISA/210) dated Jul. 19, 2016.
Notice of Rejection for Japanese Application No. 2016-561876 dated Jan. 24, 2017.
Written Opinion of the International Searching Authority for PCT/JP2016/062150 (PCT/ISA/237) dated Jul. 19, 2016.

* cited by examiner

*Primary Examiner* — John A McPherson
(74) *Attorney, Agent, or Firm* — Birch, Stewart, Kolasch & Birch LLP

(57) ABSTRACT

Provided is a method for manufacturing a conductive pattern forming member that is formed on a substrate and that has excellent resistance to ion migration between a conductive pattern and a photosensitive resin layer, while suppressing generation of residues in the dissolution and removal of unexposed portions. This method for manufacturing a conductive pattern forming member includes: a coating step of applying, onto surfaces of a layer A formed of a resin (a) having a carboxyl group, and a transparent electrode layer B, the layers A and B being formed over a substrate, a composition C containing conductive particles and a resin (c) having a double bond and a carboxyl group to obtain a coating film C; a drying step of drying the coating film C to obtain a dry film C; an exposure step of exposing the dry film C to light to obtain an exposed film C; a developing step of developing the exposed film C to obtain a pattern C; and a curing step of curing the pattern C to obtain a conductive pattern C, wherein particles having a particle diameter of 0.3 to 2.0 μm account for 80% or more of the conductive particles.

15 Claims, 5 Drawing Sheets

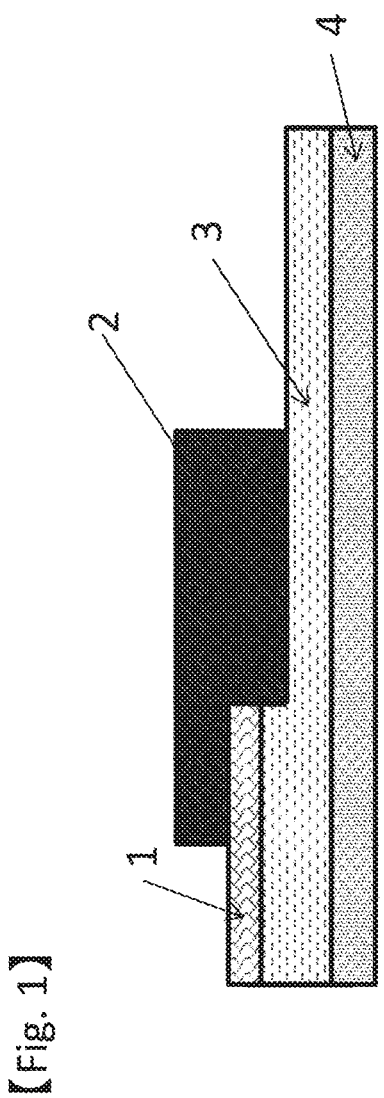
[Fig. 1]

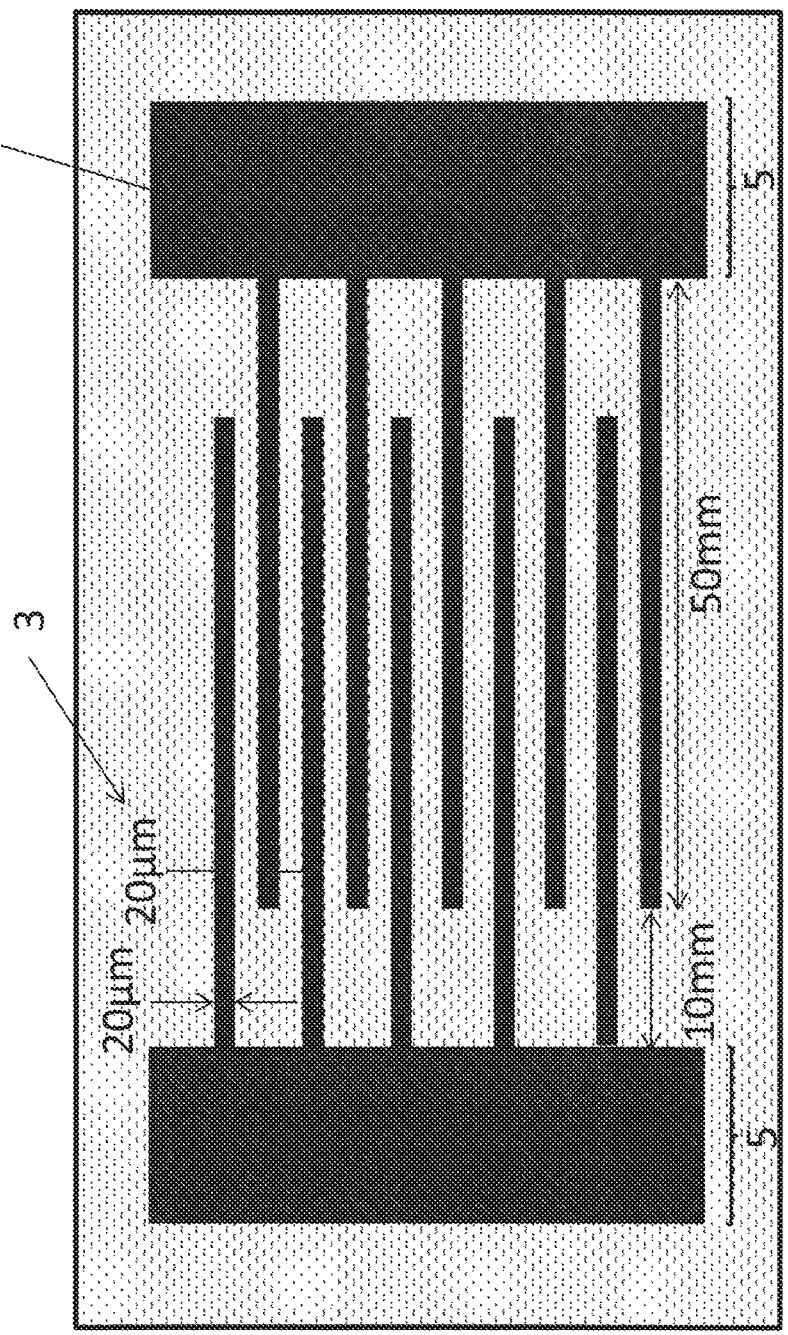

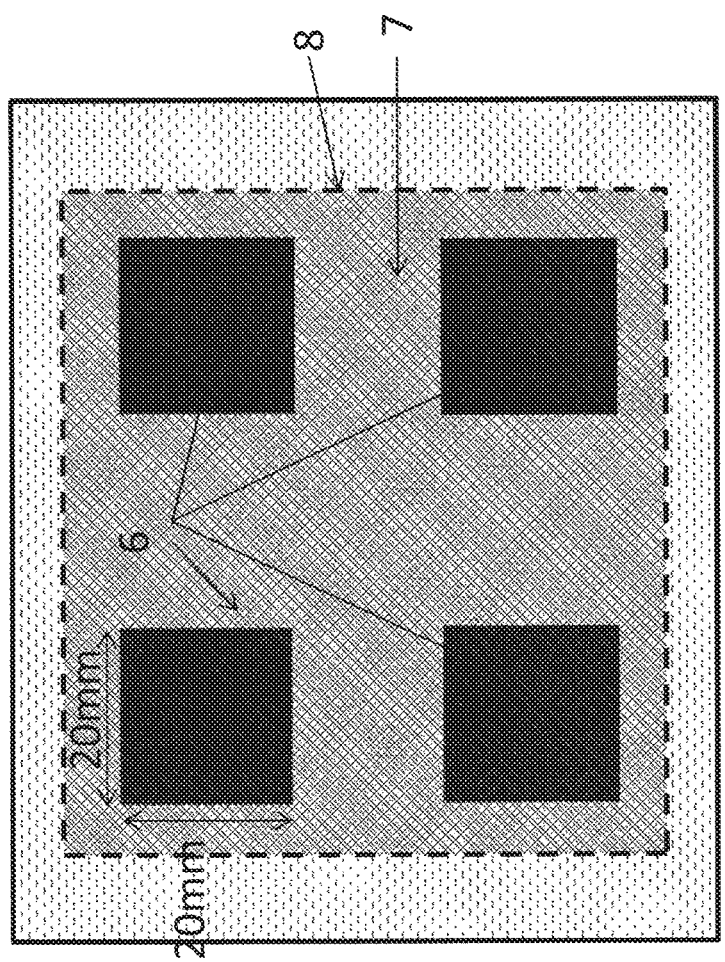
[Fig. 3]

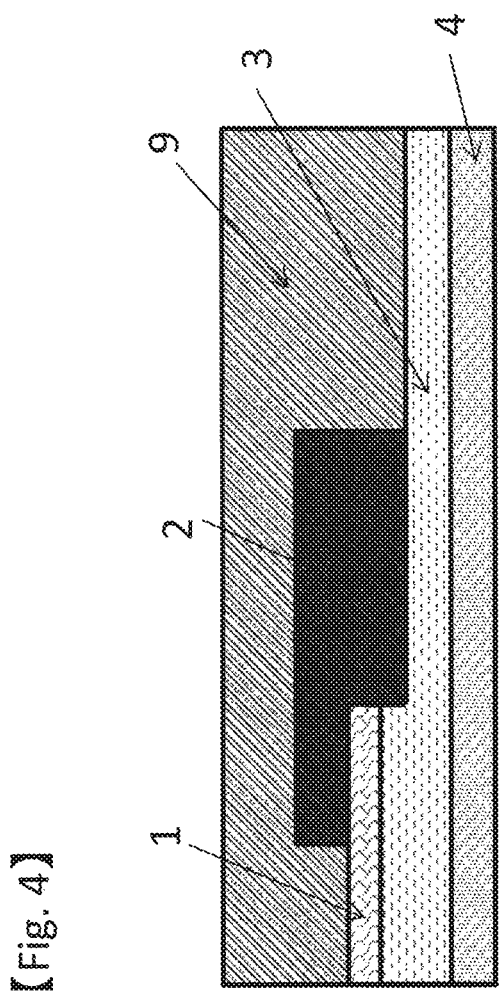

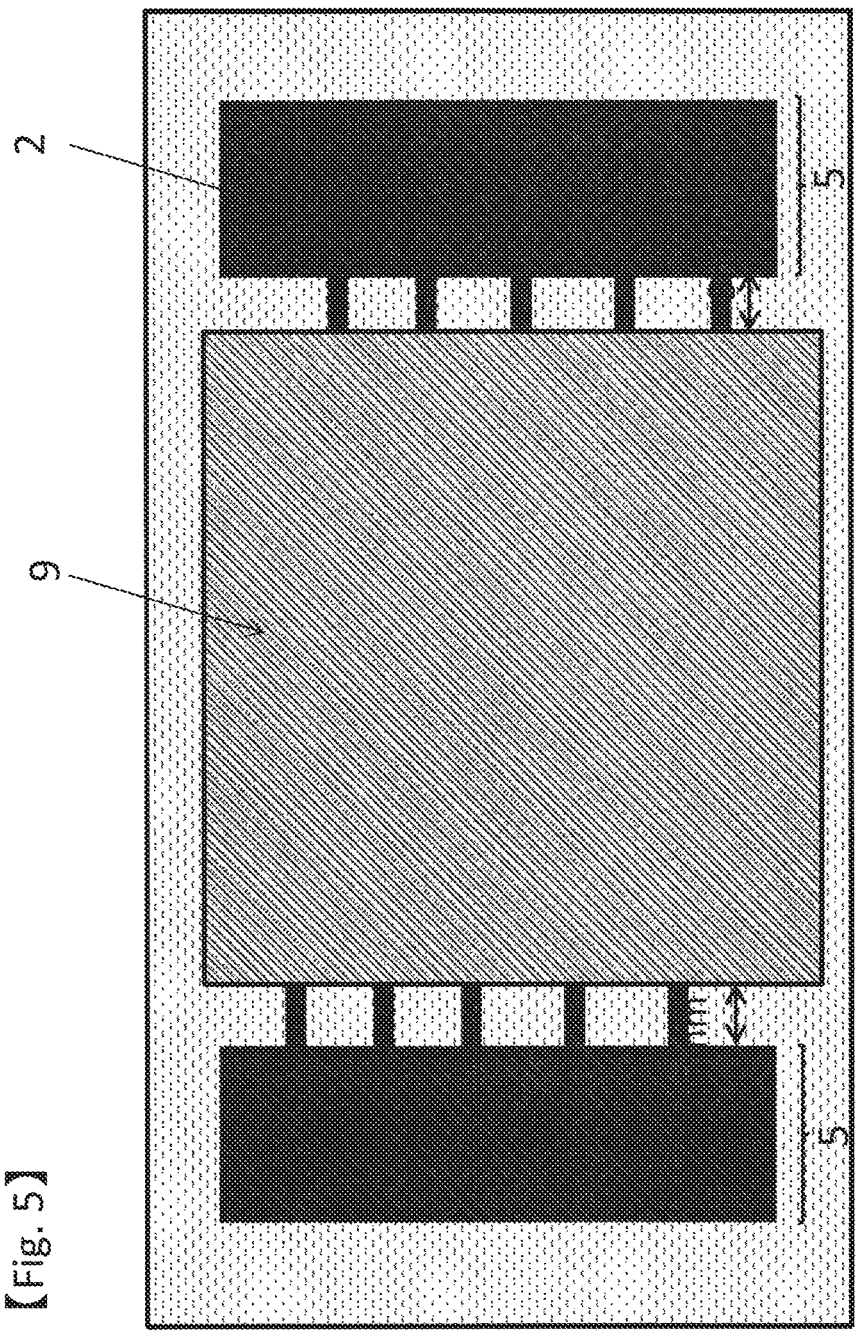
[Fig. 5]

METHOD FOR MANUFACTURING CONDUCTIVE PATTERN FORMING MEMBER

CROSS REFERENCE TO RELATED APPLICATIONS

This application is a Continuation of PCT International Application No. PCT/JP2016/062150, filed on Apr. 15, 2016, which claims priority under 35 U.S.C. 119(a) to Patent Application No. 2015-086437, filed in Japan on Apr. 21, 2015, all of which are hereby expressly incorporated by reference into the present application.

TECHNICAL FIELD

The present invention relates to a method for manufacturing a conductive pattern forming member.

BACKGROUND ART

Display electrodes formed in display areas of capacitance touch panels are transparent electrodes formed of ITO (indium tin oxide), for example. As a process of the patterning thereof, it is common to form a metal thin film of ITO or the like on a substrate by sputtering or the like, further apply a photoresist made of a photosensitive resin to the surface of the thin film, expose the photoresist to light through a photomask, form a resist pattern by development, and then perform etching and removal of the resist.

There has also been devised a technique of omitting application or removal of a photoresist every time a pattern of a transparent electrode is formed, by preparing an item composed of a photosensitive resin layer and a transparent electrode layer stacked beforehand on a substrate (Patent Documents 1 and 2).

In a capacitance touch panel, surrounding wires for connection to a transparent electrode are formed around a display area. As a method of forming the surrounding wires, there is known a method of finely processing a photosensitive conductive paste by a photolithography method (Patent Documents 3 to 7). When trying to use this conductive paste so as to form surrounding wires for connection to a transparent electrode pattern formed from a substrate on which the above-mentioned photosensitive resin layer and transparent electrode layer are stacked, it is necessary to apply a conductive paste to the surfaces of the photosensitive resin layer and the transparent electrode layer formed over the substrate and then process the conductive paste.

PRIOR ART DOCUMENTS

Patent Documents

Patent Document 1: Japanese Patent Laid-open Publication No. 2015-18157
Patent Document 2: Japanese Patent Laid-open Publication No. 2014-199814
Patent Document 3: Japanese Patent No. 5278632
Patent Document 4: WO 2013/108696
Patent Document 5: Japanese Patent No. 5360285
Patent Document 6: Japanese Patent No. 5403187
Patent Document 7: WO 2013/146107

SUMMARY OF THE INVENTION

Problems to be Solved by the Invention

In a site on the surface of a photosensitive resin layer stacked on a substrate, on which a coating film of a conductive paste is formed, however, residues are generated during dissolution and removal of unexposed portions of the coating film formed of the conductive paste in a developing step performed after exposing the conductive paste to light through a photomask, and also ion migration between the conductive pattern formed and the photosensitive resin layer has been considered problematic.

Then, an object of the present invention is to provide a method for manufacturing a conductive pattern forming member that has excellent resistance to ion migration between a conductive pattern and a photosensitive resin layer formed on a substrate while suppressing generation of residues in the dissolution and removal of unexposed portions.

Solutions to the Problems

As a result of earnest investigations, the present inventors found that use of conductive particles whose particle diameter satisfies a certain condition as conductive particles contained in the conductive paste to be used for forming a conductive pattern is extremely effective for solving the above-mentioned problems, and thus have accomplished the present invention.

That is, the present invention provides a method for manufacturing a conductive pattern forming member, comprising: a coating step of applying, onto surfaces of a layer A formed of a resin (a) having a carboxyl group, and a transparent electrode layer B, the layers A and B being formed over a substrate, a composition C containing conductive particles and a resin (c) having a double bond and a carboxyl group to obtain a coating film C; a drying step of drying the coating film C to obtain a dry film C; an exposure step of the exposing the dry film C to light to obtain an exposed film C; a developing step of developing the exposed film C to obtain a pattern C; and a curing step of curing the pattern C to obtain a conductive pattern C, wherein particles having a particle diameter of 0.3 to 2.0 μm account for 80% or more of the conductive particles.

EFFECTS OF THE INVENTION

According to the method for manufacturing a conductive pattern forming member of the present invention, it is possible to suppress generation of residues in the dissolution and removal of unexposed portions, and it is also possible to form a conductive pattern excellent in resistance to ion migration between the conductive pattern and a layer of a resin having a carboxyl group formed on a substrate.

Moreover, it is possible to enhance resistance to ion migration by further stacking an OCA having a benzotriazole-based compound or an isobornyl skeleton.

BRIEF DESCRIPTION OF THE DRAWINGS

FIG. 1 is a schematic view illustrating a cross section of a conductive pattern forming member.
FIG. 2 is a schematic view of a conductive pattern used for the evaluation of resistance to ion migration.
FIG. 3 is a schematic view of a conductive pattern used for the evaluation of residues.
FIG. 4 is a schematic view illustrating a cross section of a conductive pattern forming member with an OCA layer stacked thereon.
FIG. 5 is a schematic view of a conductive pattern with an OCA layer stacked thereon used for the evaluation of resistance to ion migration.

EMBODIMENTS OF THE INVENTION

The method for manufacturing a conductive pattern forming member of the present invention is characterized in that the method comprises a coating step of applying, onto surfaces of a layer A formed of a resin (a) having a carboxyl group, and a transparent electrode layer B, the layers A and B being formed over a substrate, a composition C containing conductive particles and a resin (c) having a double bond and a carboxyl group to obtain a coating film C; a drying step of drying the coating film C to obtain a dry film C; an exposure step of exposing the dry film C to light to obtain an exposed film C; a developing step of developing the exposed film C to obtain a pattern C; and a curing step of curing the pattern C to obtain a conductive pattern C, and that particles having a particle diameter of 0.3 to 2.0 μm account for 80% or more of the conductive particles.

The coating step of the method for manufacturing a conductive pattern forming member of the present invention is a step of applying a composition C onto the surfaces of a resin layer A and a transparent electrode layer B to obtain a coating film C.

The transparent electrode layer B is stacked on the layer A (hereinafter, "resin layer A") formed of a resin (a) having a carboxyl group (hereinafter, "resin (a)"). The resin layer A is formed on a substrate.

The substrate on which the resin layer A is formed refers to a support for forming a transparent electrode layer, a conductive pattern, and the like on the surface thereof. Examples of the substrate include rigid substrates, such as glass, glass epoxy substrates, and ceramic substrates, and flexible substrates, such as polyester films and polyimide films.

The resin layer A formed on the substrate is a so-called photosensitive resin layer and serves as a photoresist for forming a pattern of the transparent electrode layer B. The resin (a) that constitutes the resin layer A has a carboxyl group in its molecular chain and is alkali-soluble. Examples of the resin (a) include acrylic copolymers, epoxy carboxylate compounds, polyamic acids, and siloxane polymers. An acrylic copolymer that is high in visible light transmittance and an epoxy carboxylate compound are preferred.

The acrylic copolymer having a carboxyl group is produced by copolymerizing an acrylic monomer with an unsaturated acid, such as an unsaturated carboxylic acid, as copolymerization components.

Examples of the acrylic monomer include acrylic acid (hereinafter, "AA"), methyl acrylate, ethyl acrylate (hereinafter, "EA"), 2-ethylhexyl acrylate, N-butyl acrylate (hereinafter, "BA"), isobutyl acrylate, iso-propane acrylate, glycidyl acrylate, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, aminoethyl acrylate, phenyl acrylate, phenoxyethyl acrylate, 1-naphthyl acrylate, 2-naphthyl acrylate, thiophenol acrylate, benzyl mercaptan acrylate, allylated cyclohexyl diacrylate, methoxylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, neopentyl glycol diacrylate, propylene glycol diacrylate, polypropylene glycol diacrylate, triglycerol diacrylate, trimethylolpropane triacrylate, ditrimethylolpropane tetraacrylate, dipentaerythritol monohydroxypentaacrylate, dipentaerythritol hexaacrylate, acrylamide, N-methoxymethylacrylamide, N-ethoxymethylacrylamide, N-n-butoxymethylacrylamide, N-isobutoxymethylacrylamide; epoxyacrylate monomers or γ-acryloxypropyl trimethoxysilane, such as an acrylic acid adduct of ethylene glycol diglycidyl ether having a hydroxy group formed by ring-opening an epoxy group with an unsaturated acid, an acrylic acid adduct of diethylene glycol diglycidyl ether, an acrylic acid adduct of neopentyl glycol diglycidyl ether, an acrylic acid adduct of glycerol diglycidyl ether, an acrylic acid adduct of bisphenol A diglycidyl ether, an acrylic acid adduct of bisphenol F, and an acrylic acid adduct of cresol novolac; and compounds formed by replacing the acrylic groups of the foregoing with methacrylic groups. Acrylic monomers having an aliphatic chain or alicyclic structure are preferred in order to enhance the visible light transmissibility of the resin layer A.

Examples of the unsaturated acid include acrylic acid, methacrylic acid, itaconic acid, crotonic acid, maleic acid, fumaric acid, and vinyl acetate, and acid anhydrides thereof. The acid value of the resulting acrylic copolymer can be adjusted by varying the amount of the unsaturated acid to be used as a copolymerization component.

The epoxy carboxylate compound refers to any compound that can be synthesized by using an epoxy compound and a carboxyl compound having an unsaturated double bond as starting materials.

Examples of the epoxy compound that can serve as a starting material include glycidyl ethers, alicyclic epoxy resins, glycidyl esters, glycidyl amines, and epoxy resins. More specific examples include methyl glycidyl ether, ethyl glycidyl ether, butyl glycidyl ether, ethylene glycol diglycidyl ether, diethylene glycol diglycidyl ether, propylene glycol diglycidyl ether, tripropylene glycol diglycidyl ether, neopentyl glycol diglycidyl ether, bisphenol A diglycidyl ether, hydrogenated bisphenol A diglycidyl ether, bisphenol F diglycidyl ether, bisphenol S diglycidyl ether, bisphenol fluorene diglycidyl ether, biphenol diglycidyl ether, tetramethyl biphenol glycidyl ether, trimethylolpropane triglycidyl ether, 3',4'-epoxycyclohexylmethyl-3,4-epoxycyclohexane carboxylate, and tert-butylglycidylamine.

Examples of the carboxyl compound having an unsaturated double bond that can serve as a starting material include (meth)acrylic acid, crotonic acid, cinnamic acid, and α-cyanocinnamic acid.

The acid value of an epoxy carboxylate compound can be adjusted by reacting the epoxy carboxylate compound with a polybasic acid anhydride. Examples of the polybasic acid anhydride include succinic anhydride, phthalic anhydride, tetrahydrophthalic anhydride, hexahydrophthalic anhydride, itaconic anhydride, 3-methyltetrahydrophthalic anhydride, 4-methylhexahydrophthalic anhydride, trimellitic anhydride, and maleic anhydride.

The amount of reactive unsaturated double bonds of the epoxy carboxylate compound can be adjusted by reacting the carboxyl groups possessed by the epoxy carboxylate compound whose acid value has been adjusted with the above-mentioned polybasic acid anhydride with a compound having an unsaturated double bond, such as glycidyl (meth)acrylate.

The hydroxy group of an epoxy carboxylate compound can be urethanized by reacting the hydroxy group with a diisocyanate compound. Examples of the diisocyanate compound include hexamethylene diisocyanate, tetramethylxylene diisocyanate, naphthalene-1,5-diisocyanate, tolidine diisocyanate, trimethylhexamethylene diisocyanate, isophorone diisocyanate, allylcyan diisocyanate, and norbornane diisocyanate.

The acid value of the resin (a) is preferably 50 to 250 mg KOH/g in order that the resin layer A serves as an alkali-soluble photoresist, and more preferably 60 to 150 mg KOH/g in order to enhance pattern processability. The acid value of the resin (a) can be measured according to JIS K0070 (1992).

The visible light transmittance of the resin layer A is preferably 80% or more when a conductive pattern forming member produced by the manufacturing method of the present invention is used as a constituent element of a touch panel.

The transparent electrode layer B stacked on the resin layer A is not an entirely flat layer but is an arbitrarily shaped pattern that is formed by patterning utilizing the function of the resin layer A as a photoresist. That is, the transparent electrode layer does not cover the resin layer A completely, and the resin layer A is exposed at a site on which the pattern of the transparent electrode layer B is not formed.

The transparent electrode layer B is formed only of a conductive component or contains a conductive component. Examples of the conductive component that constitutes the transparent electrode layer B include indium, tin, zinc, gallium, antimony, titanium, zirconium, magnesium, aluminum, gold, silver, copper, palladium, and tungsten as well as oxides of these metals and carbon nanotubes. More specific examples include indium tin oxide (hereinafter, "ITO"), indium zinc oxide, indium oxide-zinc oxide composite oxide, aluminum zinc oxide, gallium zinc oxide, fluorine zinc oxide, fluorine indium oxide, antimony tin oxide, and fluorine tin oxide. Especially, ITO or fibrous silver (hereinafter, "silver fiber"), which is high in conductivity and visible light transmissibility and advantageous in cost, and a silver fiber, which is high in connection reliability with a conductive pattern C described later, are more preferred.

Examples of a method for forming a transparent electrode layer before patterning include vacuum evaporation, sputtering, ion plating, and coating.

The thickness of the transparent electrode layer B is preferably 0.01 to 1.5 μm in order to achieve both good conductivity and good visible light transmissibility. The visible light transmittance of the transparent electrode layer B is preferably 80% or more for the same reason as that for the resin layer A.

The composition C to be applied to the surfaces of the resin layer A and the transparent electrode layer B contains conductive particles and a resin (c) having a double bond and a carboxyl group (hereinafter, "resin (c)").

Examples of the conductive particles contained in the composition C include silver, gold, copper, platinum, lead, tin, nickel, aluminum, tungsten, molybdenum, chromium, titanium, and indium as well as alloys of these metals. Silver, gold, and copper, which are high in conductivity, are preferred, and silver, which is high in stability and advantageous in cost, is more preferred.

As to the shape of the conductive particles, the aspect ratio, which is a value determined by dividing the major axis length by the minor axis length, is preferably 1.0 to 3.0, more preferably 1.0 to 2.0. When the aspect ratio of the conductive particles is 1.0 or more, the contact probability of conductive particles will increase. On the other hand, when the aspect ratio of the conductive particles is 2.0 or less, exposure light is hard to be blocked during the exposure step described below, resulting in an enlarged development margin. The aspect ratio of the conductive particles can be determined by observing conductive particles with a scanning electron microscope (SEM) or a transmission electron microscope (TEM), choosing 100 primary particles of conductive particles at random, measuring the major axis length and the minor axis length of each of the primary particles, and calculating an aspect ratio from the average values of both of the axis lengths.

The particle diameter of the conductive particles is preferably 0.3 to 2.0 μm, more preferably 0.5 to 1.5 μm. If the composition C is applied to the resin layer A, the resin layer A is swollen by components contained in the composition C, and the conductive particles are captured into the resin layer A and residues are readily formed. If the particle diameter of the conductive particles is 0.3 μm or more, conductive particles captured into the resin layer A are exposed easily during the following developing step and it becomes possible to wash off the exposed particles and, as a result, resistance to ion migration is improved. On the other hand, if the particle diameter of the conductive particles is 2.0 μm or less, the straight travel property of the resulting conductive pattern C is enhanced. In order to acquire a residue suppressing effect as described above, the proportion accounted for by particles having a particle diameter of 0.3 to 2.0 μm in the conductive particles contained in the composition C is required to be 80% or more and is preferably 90% or more in the method for manufacturing a conductive pattern forming member of the present invention.

The particle diameter of conductive particles can be calculated by observing conductive particles with an electron microscope, choosing 20 primary particles of the conductive particles at random, measuring the maximum width of each of the primary particles, and calculating the average value of the maximum widths. The proportion accounted for by particles having a particle diameter of 0.3 to 2.0 μm in the conductive particles contained in the composition C can be determined by observing conductive particles with an electron microscope, choosing 100 primary particles of conductive particles at random, measuring the maximum width of each of the primary particles, and determining that proportion from the proportion accounted for by primary particles having a maximum width within the range of 0.3 to 2.0 μm.

The particle diameter of the conductive particles contained in the conductive pattern C can be determined by dissolving a sampled conductive pattern C in tetrahydrofuran (hereinafter, "THF"), collecting conductive particles that have sedimented, drying the collected particles at 70° C. for 10 minutes using a box oven, and then calculating the particle diameter in the same manner as described above.

The proportion accounted for by the conductive particles in the solid component contained in the composition C is preferably 60 to 95% by mass. If the proportion accounted for by the conductive particles is 60% by mass or more, the contact probability of conductive particles increases and the resistance of a resulting conductive pattern C can be stabilized. On the other hand, if the proportion accounted for by the conductive particles is 95% by mass or less, exposure light is hard to be blocked during the exposure step described below, resulting in an enlarged development margin. The solid component refers to all components of the composition C excluding the solvent.

Examples of the resin (c) contained in the composition C include an acrylic copolymer and an epoxy carboxylate compound. The epoxy carboxylate compound is preferred in order to enhance the adhesion of a resulting conductive pattern C.

An acrylic copolymer having a double bond and a carboxyl group is obtained by copolymerizing an acrylic monomer with an unsaturated acid having a carboxyl group and an unsaturated double bond as copolymerization components. Examples of the unsaturated acid include AA, methacrylic acid, itaconic acid, crotonic acid, maleic acid, fumaric acid, and vinyl acetate as well as acid anhydrides thereof. The acid value of the resulting acrylic copolymer can be adjusted by varying the amount of the unsaturated acid to be used as a copolymerization component.

The acid value of the resin (c) is preferably equal to that of the resin (a). The acid value of the resin (c) can be measured in the same manner as that for the resin (a).

The composition C can contain a photopolymerization initiator. Examples of the photopolymerization initiator include 1,2-octanedione-1-[4-(phenylthio)-2-(O-benzoyloxime)], 2,4,6-trimethylbenzoyl-diphenyl-phosphine oxide, bis(2,4,6-trimethylbenzoyl)-phenylphosphine oxide, ethanone-1-[9-ethyl-6-2(2-methylbenzoyl)-9H-carbazol-3-yl]-1-(O-acetyloxime), benzophenone, methyl o-benzoylbenzoate, 4,4'-bis(dimethylamino)benzophenone, 4,4'-bis(diethylamino)benzophenone, 4,4'-dicyclobenzophenone, 4-benzoyl-4'-methyldiphenyl ketone, dibenzyl ketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzil, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methyleneanthrone, 4-azidobenzalacetophenone, 2,6-bis(p-azidobenzylidene)cyclohexanone, 6-bis(p-azidobenzylidene)-4-methylcyclohexanone, 1-phenyl-1,2-butanedione-2-(O-methoxycarbonyl)oxime, 1-phenyl-propanedione-2-(O-ethoxycarbonyl)oxime, 1-phenyl-propanedione-2-(O-benzoyl)oxime, 1,3-diphenyl-propanetrione-2-(O-ethoxycarbonyl)oxime, 1-phenyl-3-ethoxy-propanetrione-2-(O-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyldisulfide, benzthiazole disulfide, triphenylphosphine, camphorquinone, 2,4-diethylthioxanthone, isopropylthioxanthone, carbon tetrabromide, tribromophenylsulfone, benzoin peroxide, eosin, and combinations of a photoreductive pigment such as methylene blue with a reducing agent such as ascorbic acid and triethanolamine. Oxime ester-based compounds, which are highly photosensitive, are preferred.

The amount of the photopolymerization initiator added is preferably 0.05 to 30 parts by mass relative to 100 parts by mass of the resin (c). When the amount of the photopolymerization initiator added is 0.05 parts by mass or more, the curing density of exposed portions increases and the post-development residual film rate can thus be increased. On the other hand, when the amount of the photopolymerization initiator added is 30 parts by mass or less, excessive photo-absorption by the photopolymerization initiator that occurs in an upper portion of the coating C film resulting from the application of the composition C is suppressed. As a result, the resulting conductive pattern C is inhibited from being reversely tapered to decrease in adhesion to the resin layer A.

The composition C can contain a sensitizer together with the photopolymerization initiator.

Examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole, and 1-phenyl-5-ethoxycarbonylthiotetrazole.

The amount of the sensitizer added is preferably 0.05 to 10 parts by mass relative to 100 parts by mass of the resin (c). When the sensitizer is added in an amount of 0.05 parts by mass or more, the photo-sensitivity is improved. On the other hand, when the amount of the sensitizer added is 10 parts by mass or less, excessive photo-absorption that occurs in an upper portion of the coating film C resulting from the application of a conductive paste is suppressed. As a result, the produced conductive pattern C is inhibited from being reversely tapered to decrease in adhesion to the resin layer A.

The composition C can contain a solvent. Preferred as the solvent is an alcoholic solvent having a boiling point of 200° C. or more, which is high in solvency for the resin (c) and hardly allows uneven coating caused by the volatilization of the solvent. Examples of the alcoholic solvent having a boiling point of 200° C. or more include diethylene glycol, triethylene glycol, 1,3-butanediol, glycerol, benzyl alcohol, dipropylene glycol, 1,4-butanediol, octanediol, 2,2,4-trimethyl-1,3-pentanediol monoisobutyrate, ethylene glycol mono-2-ethylhexyl ether, 2,4-diethyl-1,5-pentanediol, 2-butyl-2-ethyl-1,3-propanediol, 3,5,5-trimethyl-1-hexanol, isodecanol, isotridecanol, and ethylene glycol monohexyl ether.

The amount of the solvent added is preferably 10 to 200 parts by mass relative to 100 parts by mass of the resin (c). If the amount of the solvent added is 10 parts by mass or more, it is easy to control the thickness of the coating film of the composition C to be uniform. On the other hand, if the amount of the solvent added is 200 parts by mass or less, it is possible to inhibit sedimentation of conductive particles that are occurred during the storage of the composition C.

The composition C can contain an epoxy resin. Examples of the epoxy resin include ethylene glycol-modified epoxy resin, bisphenol A type epoxy resin, hydrogenated bisphenol A type epoxy resin, brominated epoxy resin, bisphenol F type epoxy resin, novolac type epoxy resin, alicyclic epoxy resin, glycidyl amine type epoxy resin, glycidyl ether type epoxy resin, and heterocyclic epoxy resin. In order to enhance the adhesion of a resulting conductive pattern C to the resin layer A, bisphenol A type epoxy resin or hydrogenated bisphenol A type epoxy resin is preferred, and hydrogenated bisphenol A type epoxy resin, which has high exposure light transmissibility, is more preferred.

As to the amount of the epoxy resin added, when the amount of the epoxy resin added is 0.05 parts by mass or more relative to 100 parts by mass of the resin (c), it is possible to enhance the adhesion between the resulting conductive pattern C and the resin layer A. On the other hand, when the amount of the epoxy resin added is 20 parts by mass or less relative to 100 parts by mass of the resin (c), the solubility of the exposed film C in a developer is enhanced.

Examples of the method of applying the composition C include spin coating using a spinner, spray coating, roll coating, screen printing, and coating using a blade coater, a die coater, a calender coater, a meniscus coater, or a bar coater.

The drying step of the method for manufacturing a conductive pattern forming member of the present invention is a step of drying a coating film C to obtain a dry film C.

The thickness of the resulting dry film C is preferably 1 to 20 µm. The thickness of the dry film C can be measured using a probe type step profiler (e.g. SURFCOM (registered trademark) 1400; manufactured by TOKYO SEIMITSU CO., LTD.). More specifically, the film thickness is measured at three randomly chosen positions using a probe type step profiler (measurement length: 1 mm; scanning speed: 0.3 mm/sec), and an average value thereof is defined as the thickness of the dry film C.

Examples of the method of drying the coating film C include heat drying using a box oven, a hot plate, an infrared ray, or the like and vacuum drying. The heating temperature is preferably 50 to 80° C., more preferably 60 to 80° C. When the heating temperature is 50° C. or more, the dry film C comes to contain the solvent and the like in sufficiently small amounts, resulting in a wide development margin. On the other hand, when the heating temperature is 80° C. or less, the resin layer A is hardly swollen and conductive particles are captured in a reduced amount into the resin layer A, so that residues are hardly formed during a developing step. The heating time is preferably 1 minute to several hours. The heating temperature refers to the temperature measured at the surface of the substrate with a K thermocouple.

The exposure step of the method for manufacturing a conductive pattern forming member of the present invention is a step of exposing the coating film C to light to obtain a dry film C.

Examples of the light source for exposure include a high pressure mercury lamp, an ultrahigh pressure mercury lamp, and an LED that emits i line (365 nm), h line (405 nm), or g line (436 nm). Examples of the method of exposure to light include vacuum adsorption exposure, proxy exposure, projection exposure, and direct drawing exposure.

The developing step of the method for manufacturing a conductive pattern forming member of the present invention is a step of developing the exposed film C to dissolve and remove unexposed portions, and thereby obtain a desired pattern C.

Examples of the developer to be used for alkali development include aqueous solutions of tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. To such aqueous solutions can be added polar solvents such as N-methyl-2-pyrrolidone, N,N-dimethylformamide, N,N-dimethylacetamide, dimethyl sulfoxide, and γ-butyrolactone, alcohols such as methanol, ethanol and isopropanol, esters such as ethyl lactate and propylene glycol monomethyl ether acetate, ketones such as cyclopentanone, cyclohexanone, isobutyl ketone and methyl isobutyl ketone, and surfactants.

Examples of the developer to be used for organic development include polar solvents such as N-methyl-2-pyrrolidone, N-acetyl-2-pyrrolidone, N,N-dimethylacetamide, N,N-dimethylformamide, dimethyl sulfoxide, and hexamethylphosphortriamide, and mixed solutions of these polar solvents with methanol, ethanol, isopropyl alcohol, xylene, water, methyl carbitol or ethyl carbitol.

Examples of the method of development include a method in which a developer is sprayed to the surface of an exposed film C while a substrate is left to stand or rotated, a method in which, using a conveyor, a substrate is made to pass through a developing bath equipped with many nozzles for ejecting a developer, a method in which a substrate is immersed in a developer, and a method in which a substrate is immersed in a developer while an ultrasonic wave is applied to the substrate. The development by making a substrate pass through a developing bath using a conveyor is preferred from the viewpoint of developing the film over a large area uniformly. In that case, the pressure of the developer to be ejected from the nozzles is preferably 0.02 to 0.2 MPa. When the pressure of the developer is 0.02 MPa or more, it becomes easy to remove conductive particles captured in the resin layer A by a hitting power. On the other hand, when the pressure of the developer is 0.2 MPa or less, the adhesion of a resulting pattern C to the resin layer A hardly deteriorates. The pattern C obtained in the developing step can be subjected to a rinsing treatment with a rinsing liquid. Examples of the rinsing liquid include water, and aqueous solutions obtained by adding to water an alcohol such as ethanol and isopropyl alcohol, or an ester such as ethyl lactate and propylene glycol monomethyl ether acetate.

The curing step of the method for manufacturing a conductive pattern forming member of the present invention is a step of curing a pattern C to obtain a conductive pattern C.

The curing temperature is preferably 100 to 300° C., more preferably 120 to 180° C. If the curing temperature is lower than 100° C., the amount of volume shrinkage of the resin (c) cannot be made large, and the specific resistance of a resulting conductive pattern C does not become sufficiently low. On the other hand, if the curing temperature exceeds 300° C., a conductive pattern cannot be formed on a substrate or the like that is low in heat resistance.

Examples of the method of curing include heat drying with an oven, an inert oven, or a hot plate, heat drying with electromagnetic waves such as an ultraviolet lamp, an infrared heater, a halogen heater, or a xenon flash lamp, heat drying with microwaves, and vacuum drying. By heating, the hardness of the resulting conductive pattern C is increased, and it is possible to inhibit chipping or peeling caused by contact with other members, and moreover it is possible to enhance the adhesion to the resin layer A.

In order to enhance the resistance to ion migration, the difference between the acid value SA of the resin layer A and the organic component acid value SC of the conductive pattern C (the value of SA−SC) is preferably 20 to 150 mg KOH/g, more preferably 30 to 100 mg KOH/g, and even more preferably 40 to 90 mg KOH/g. The resulting conductive pattern C is high in hygroscopicity due to the existence of the resin (c) having a carboxyl group, so that an ion migration phenomenon originating from conductive particles readily occurs. However, when the value of SA−SC is 20 mg KOH/g or more, the moisture absorption by the conductive pattern C is inhibited because moisture is absorbed preferentially by the resin layer A, so that the resistance to ion migration of a conductive pattern forming member can be enhanced. On the other hand, when the value of SA−SC is 150 mg KOH/g or less, the amount of hydrogen bonds between carboxyl groups of the resin (a) and the resin (c) contained in the resin layer A and the conductive pattern C, respectively, can be increased, so that the adhesion between the resin layer A and the conductive pattern C can be enhanced.

The value of SA can be determined by dissolving 1 part by mass of a sampled resin layer A in 100 parts by mass of THF, and titrating the solution with a 0.1 mol/L potassium hydroxide solution using a phenolphthalein solution as an indicator.

As to the value of SC, the acid value of the conductive pattern C can be determined by dissolving 1 part by mass of a sampled conductive pattern C in 10 parts by mass of THF, removing conductive particles with a filter or the like, and titrating the solution with a 0.1 mol/L potassium hydroxide solution using a phenolphthalein solution as an indicator.

When an epoxy resin is contained in the composition C, carboxyl groups react during the curing step, so that the organic component acid value of the conductive pattern C can be reduced.

The conductive pattern forming member of the present invention can be coated with an OCA (Optical Clear Adhesive) layer D having a benzotriazole-based compound or an isobornyl skeleton for the purpose of suppressing migration.

Examples of the benzotriazole-based compound include 1H-benzotriazole (1,2,3-benzotriazole), 4-methylbenzotriazole, 5-methylbenzotriazole, benzotriazole-1-methylamine, 4-methylbenzotriazole-1-methylamine, 5-methylbenzotriazole-1-methylamine, N-methylbenzotriazole-1-methylamine, N-ethylbenzotriazole-1-methylamine, N,N-dimethylbenzotriazole-1-methylamine, N,N-diethylbenzotriazole-1-methylamine, N,N-dipropylbenzotriazole-1-methylamine, N,N-dibutylbenzotriazole-1-methylamine, N,N-dihexylbenzotriazole-1-methylamine, N,N-dioctylbenzotriazole-1-methylamine, N,N-dimethyl-4-benzotriazole-1-methylamine, N,N-dimethyl-5-benzotriazole-1-methylamine, N,N-diethyl-4-benzotriazole-1-methylamine, N,N-diethyl-5-benzotriazole-1-methylamine, N,N-dipropyl-4-benzotriazole-1-methylamine, N,N-dipropyl-5-benzotriazole-1-methylamine, N,N-dibutyl-4-benzotriazole-1-methylamine, N,N-dibutyl-5-benzotriazole-1-methylamine, N,N-dihexyl-4-benzotriazole-1-methylamine, and N,N-dihexyl-5-benzotriazole-1-methylamine.

Examples of the compound having an isobornyl skeleton include isobornyl acetate, isobornyl acrylate, isobornyl methacrylate, and isobornyl cyclohexanol, and such a compound can be contained as one of the constituents of an acrylic copolymer.

The OCA material for forming the OCA layer D can be obtained by applying a pressure-sensitive adhesive containing the above compound to a release-treated substrate, and then drying the pressure-sensitive adhesive. The OCA layer D can be formed by hot pressing the resulting OCA material with a heat laminator or the like.

The touch panel of the present invention includes a conductive pattern forming member produced by the manufacturing method of the present invention. More specifically, a conductive pattern forming member produced by the manufacturing method of the present invention can suitably be used as a member for a touch panel. Examples of the type of touch panel include a resistive film type, an optical type, an electromagnetic induction type, and a capacitance type. The conductive pattern forming member of the present invention is more suitably used in the capacitance touch panel because this type of touch panel requires particularly fine wires. In a touch panel including a conductive pattern C produced by the manufacturing method of the present invention as peripheral wires of the touch panel, the peripheral wires having a pitch (wire width+inter-wire width) of 50 μm or less, the frame width can be decreased to widen a view area.

EXAMPLES

The present invention will be described below in detail by way of examples and comparative examples, but embodiments of the present invention are not limited to them.

The materials used in the examples and the comparative examples are as follows.

[Resin (a)]

Synthesis Example 1

Copolymerization ratio (mass basis): EA/2-ethylhexyl methacrylate (hereinafter, "2-EHMA")/BA/N-methylolacrylamide (hereinafter, "MAA")/AA=20/40/20/5/15

Diethylene glycol monoethyl ether acetate (hereinafter, "DMEA") (150 g) was charged into a reaction vessel under a nitrogen atmosphere, and the temperature was elevated to 80° C. using an oil bath. To this was added dropwise over 1 hour a mixture composed of 20 g of EA, 40 g of 2-EHMA, 20 g of BA, 5 g of MAA, 15 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. The resulting reaction solution was purified with methanol to remove unreacted impurities, and dried under vacuum for 24 hours to obtain a resin (a-1). The acid value of the resulting resin (a-1) was 103 mg KOH/g.

Synthesis Example 2

Copolymerization ratio (mass basis): EA/2-EHMA/BA/MAA/AA=20/20/20/15/25

DMEA (150 g) was introduced into a reaction vessel under a nitrogen atmosphere and was heated to a temperature of 80° C. using an oil bath. To this was added dropwise over 1 hour a mixture composed of 20 g of EA, 20 g of 2-EHMA, 20 g of BA, 5 g of MAA, 25 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. The resulting reaction solution was purified with methanol to remove unreacted impurities, and dried under vacuum for 24 hours to obtain a resin (a-2). The acid value of the resulting resin (a-2) was 153 mg KOH/g.

Synthesis Example 3

Copolymerization ratio (mass basis): EA/2-EHMA/BA/MAA/AA=30/20/10/25/15

DMEA (150 g) was introduced into a reaction vessel under a nitrogen atmosphere and was heated to a temperature of 80° C. using an oil bath. To this was added dropwise over 1 hour a mixture composed of 30 g of EA, 20 g of 2-EHMA, 10 g of BA, 25 g of MAA, 15 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. The resulting reaction solution was purified with methanol to remove unreacted impurities, and dried under vacuum for 24 hours to obtain a resin (a-3). The acid value of the resulting resin (a-3) was 101 mg KOH/g.

Synthesis Example 4

Copolymerization ratio (mass basis): EA/2-EHMA/BA/glycidyl methacrylate (hereinafter, "GMA")/AA=20/40/20/5/15

DMEA (150 g) was introduced into a reaction vessel under a nitrogen atmosphere and was heated to a temperature of 80° C. using an oil bath. To this was added dropwise over 1 hour a mixture composed of 20 g of EA, 40 g of 2-EHMA, 20 g of BA, 15 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture composed of 5 g of GMA, 1 g of triethylbenzylammonium chloride, and 10 g of DMEA was added dropwise over 0.5 hours. After completion of the dropwise addition, further an addition reaction was carried out for 2 hours. The resulting reaction solution was purified with methanol to remove unreacted impurities, and dried under vacuum for 24 hours to obtain a resin (a-4). The acid value of the resulting resin (a-4) was 107 mg KOH/g.

[Resin (c)]

Synthesis Example 5

Copolymerization ratio (mass basis): EA/2-EHMA/styrene (hereinafter, "St")/glycidyl methacrylate (hereinafter, "GMA")/AA=20/40/25/5/10

DMEA (150 g) was introduced into a reaction vessel under a nitrogen atmosphere and was heated to a temperature of 80° C. using an oil bath. To this was added dropwise over 1 hour a mixture composed of 20 g of EA, 40 g of 2-EHMA, 25 g of St, 10 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture composed of 5 g of GMA, 1 g of triethylbenzylammonium chloride, and 10 g of DMEA was added dropwise over 0.5 hours. After completion of the dropwise addition, further an addition reaction was carried out for 2 hours. The resulting reaction solution was purified with methanol to remove unreacted impurities, and dried under vacuum for 24 hours to obtain a resin (c-1). The acid value of the resulting resin (c-1) was 73 mg KOH/g.

Synthesis Example 6

Copolymerization ratio (mass basis): ethylene oxide-modified bisphenol A diacrylate (FA-324A; manufactured by Hitachi Chemical Co., Ltd.)/EA/GMA/AA=60/20/5/15

DMEA (150 g) was introduced into a reaction vessel under a nitrogen atmosphere and was heated to a temperature of 80° C. using an oil bath. To this was added dropwise over 1 hour a mixture composed of 60 g of ethylene oxide-modified bisphenol A diacrylate, 20 g of EA, 15 g of AA, 0.8 g of 2,2'-azobisisobutyronitrile, and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture composed of 5 g of GMA, 1 g of triethylbenzylammonium chloride, and 10 g of DMEA was added dropwise over 0.5 hours. After completion of the dropwise addition, further an addition reaction was carried out for 2 hours. The resulting reaction solution was purified with methanol to remove unreacted impurities, and dried under vacuum for 24 hours to obtain a resin (c-2). The acid value of the resulting resin (c-2) was 104 mg KOH/g.

Synthesis Example 7

To a reaction solution under a nitrogen atmosphere were charged 492.1 g of carbitol acetate, 860.0 g of EOCN-103S (manufactured by Nippon Kayaku Co., Ltd.; cresol novolac-type epoxy resin; epoxy equivalent weight: 215.0 g/Eq), 288.3 g of AA, 4.92 g of 2,6-di-tert-butyl-p-cresol, and 4.92 g of triphenylphosphine, which were then reacted at a temperature of 98° C. until the acid value of the reaction liquid reached 0.5 mg KOH/g or less, to obtain an epoxy carboxylate compound. Subsequently, to the reaction liquid were charged 169.8 g of carbitol acetate and 201.6 g of tetrahydrophthalic anhydride, which were then reacted at 95° C. for 4 hours to obtain a resin (c-3). The acid value of the resulting resin (c-3) was 104 mg KOH/g.

Synthesis Example 8

To a reaction vessel under a nitrogen atmosphere were charged 368.0 of RE-3105 (manufactured by Nippon Kayaku Co., Ltd.; epoxy equivalent weight: 184.0 g/Eq), 141.2 g of AA, 1.02 g of hydroquinone monomethyl ether, and 1.53 g of triphenylphosphine, which were then reacted at a temperature of 98° C. until the acid value of the reaction liquid reached 0.5 mg KOH/g or less, to obtain an epoxy carboxylate compound. Then, to this reaction solution were added 755.5 g of carbitol acetate, 268.3 g of 2,2-bis(dimethylol)-propionic acid, 1.08 g of 2-methylhydroquinone, and 140.3 g of spiroglycol, which were then heated to 45° C. To this solution, 485.2 g of trimethylhexamethylene diisocyanate was added dropwise slowly with the reaction temperature kept not to exceed 65° C. After completion of the dropwise addition, the reaction temperature was raised to 80° C. and the components were allowed to react for 6 hours until the solution no longer showed absorption at about 2250 $cm^{-1}$ as determined by infrared absorption spectrometry, to obtain a resin (c-4). The acid value of the resulting resin (c-4) was 80.0 mg KOH/g.

Synthesis Example 9

A reaction vessel under a nitrogen atmosphere was charged with 300 g of an acrylic acid adduct of DENACOL EX-203 (manufactured by Nagase ChemteX Corporation) (molecular weight: 368), 500 g of DMEA, 0.5 g of 2-methylhydroquinone, and 200 g of 2,2-bis(hydroxymethyl)propionic acid, which were then heated to 45° C. To the resulting solution, 201.3 g of toluene diisocyanate was added dropwise slowly with the reaction temperature kept not to exceed 50° C. After completion of the dropwise addition, the reaction temperature was raised to 80° C. and the components were allowed to react for 6 hours until the solution no longer showed absorption at about 2250 $cm^{-1}$ as determined by infrared absorption spectrometry. To the resulting solution was added 120 g of GMA, and the resulting mixture was heated to 95° C. and was allowed to react for 6 hours to obtain a resin (c-5). The acid value of the resulting compound (c-5) was 83 mg KOH/g.

[Photopolymerization Initiator]
IRGACURE (registered trademark) OXE-01 (hereinafter, "OXE-01"; manufactured by Ciba Japan K.K.)
IRGACURE (registered trademark) 369 (hereinafter, "IC-369"; manufactured by Ciba Japan K.K.)
[Monomer]
LIGHT ACRYLATE MPD-A (hereinafter, "MPD-A"; manufactured by Kyoeisha Chemical Co., Ltd.)
[Alcoholic Solvent]
Diethylene glycol (hereinafter, "DEG")
[Epoxy Resin]
jER (registered trademark) 828 (hereinafter, "828"; manufactured by Mitsubishi Chemical Corporation)
jER (registered trademark) YX-8000 (hereinafter, "YX-8000"; manufactured by Mitsubishi Chemical Corporation)
[Transparent Electrode Material]
ITO (97% by mass of indium oxide, 3% by mass of tin oxide)
Silver fiber (line diameter: 5 nm, line length: 5 μm)
[OCA (d)]

Synthesis Example 10

Ethyl acetate (150 g) was introduced into a reaction vessel under a nitrogen atmosphere and was heated to a temperature of 80° C. using an oil bath. To this was added dropwise over 1 hour a mixture composed of 50.0 g of EA, 10.0 g of 2-hydroxyethyl acrylate, 0.8 g of 2,2'-azobisisobutyronitrile, and 10 g of ethyl acetate. After completion of the dropwise addition, further a polymerization reaction was carried out for 6 hours. Thereafter, 1 g of hydroquinone monomethyl ether was added to stop the polymerization reaction.

Then, 1 g of 1,2,3-benzotriazole was added to the above acrylic copolymer solution, followed by dilution with ethyl acetate to a resin solid content of 30%, and then 1.2 g of DURANATE P301-75E (manufactured by Asahi Kasei Corporation; solid content: 75%) was added thereto. The resulting mixture was applied to a 50 μm-thick PET film release-treated on one side thereof so that the thickness after drying might become 25 μm, followed by drying at 75° C. for 5 minutes to obtain an OCA (d-1).

Synthesis Example 11

Ethyl acetate (150 g) was introduced into a reaction vessel under a nitrogen atmosphere and was heated to a temperature of 80° C. using an oil bath. To this was added dropwise over 1 hour a mixture composed of 50.0 g of isobornyl methacrylate, 10.0 g of 2-hydroxyethyl acrylate, 0.8 g of 2,2'-azobisisobutyronitrile, and 10 g of ethyl acetate. After completion of the dropwise addition, further a polymerization reaction was carried out for 6 hours. Thereafter, 1 g of hydroquinone monomethyl ether was added to stop the polymerization reaction.

Then, the above acrylic copolymer solution was diluted with ethyl acetate to a resin solid content of 30%, and then 1.2 g of DURANATE P301-75E (manufactured by Asahi Kasei Corporation; solid content: 75%) was added thereto. The resulting mixture was applied to a 50 μm-thick PET film release-treated on one side thereof so that the thickness after drying might become 25 μm, followed by drying at 75° C. for 5 minutes to obtain an OCA (d-2).

Synthesis Example 12

Ethyl acetate (150 g) was introduced into a reaction vessel under a nitrogen atmosphere and was heated to a temperature of 80° C. using an oil bath. To this was added dropwise over 1 hour a mixture composed of 50.0 g of isobornyl methacrylate, 10.0 g of 2-hydroxyethyl acrylate, 0.8 g of 2,2'-azobisisobutyronitrile, and 10 g of ethyl acetate. After completion of the dropwise addition, further a polymerization reaction was carried out for 6 hours. Thereafter, 1 g of hydroquinone monomethyl ether was added to stop the polymerization reaction.

Then, 1 g of 1,2,3-benzotriazole was added to the above acrylic copolymer solution, followed by dilution with ethyl acetate to a resin solid content of 30%, and then 1.2 g of DURANATE P301-75E (manufactured by Asahi Kasei Corporation; solid content: 75%) was added thereto. The resulting mixture was applied to a 50 μm-thick PET film release-treated on one side thereof so that the thickness after drying might become 25 μm, followed by drying at 75° C. for 5 minutes to obtain an OCA (d-3).

Example 1

<Formation of Resin Layer A>
A 30 μm-thick biaxially stretched polyethylene terephthalate film was prepared as a substrate. To one side of the substrate was applied a composition A1 prepared by mixing the resin (a-1), MPD-A, and OXE-01 in a proportion of 100:50:1, followed by heat treatment and drying. Thus, a 4 μm-thick resin layer A1 was formed.

<Formation of Transparent Electrode Layer B>
On a surface of a resin layer A was formed a 22 nm-thick ITO thin film made of ITO by using a sputtering apparatus equipped with a sintered ITO target.

<Patterning of ITO Thin Film>
A photomask was put firmly on the ITO thin film and then the resin layer A1 and the ITO thin film were exposed to light in a dose of 200 mJ/cm$^2$ using an exposure apparatus equipped with an ultrahigh pressure mercury lamp. Furthermore, the resin layer A and the ITO thin film were exposed entirely to light in a dose of 200 mJ/cm$^2$ without use of a photomask, and then, spray development was performed for 30 seconds with a 1% by mass aqueous sodium carbonate solution at 30° C. Thus, a patterned transparent electrode layer B1 was formed on the resin layer A1.

<Preparation of Composition C>
In a 100-mL clean bottle, 10.0 g of a compound (C-1), 2.0 g of IC-369, and 5.0 g of diethylene glycol were charged and mixed using a planetary centrifugal vacuum mixer "Awatori Rentaro" (registered trademark) ARE-310 (manufactured by THINKY CORPORATION), thereby obtaining 17.0 g of a resin solution C1 (solid content: 70.1% by mass).

The obtained resin solution C1 (17.0 g) and silver particles (68.0 g) were mixed together, and the mixture was kneaded using a three-roll mill (EXAKT M-50; manufactured by EXAKT) to obtain a composition C1 (85.0 g).

<Production of Conductive Pattern Forming Member>
The composition C1 was applied to the surfaces of the resin layer A1 and the patterned transparent electrode layer B1 with a screen printer so that the thickness of a dry film C1 might be 5 μm, and was dried at 70° C. for 10 minutes. Then, the dry film was exposed to light through a predetermined photomask in a dose of 300 mJ/cm$^2$ using an exposure apparatus equipped with an ultrahigh pressure mercury lamp, was developed for 30 seconds by spraying a 0.2% by mass aqueous sodium carbonate solution under a pressure of 0.1 MPa, and then was cured at 140° C. for 60 minutes. Thus, a conductive pattern forming member 1 was produced.

The acid value SA of the resin layer A1 of the conductive pattern forming member 1 was 98 mg KOH/g and the organic component acid value SC of the conductive pattern C1 was 55 mg KOH/g, and thus the value of SA−SC was 43 mg KOH/g.

<Evaluation of Residue>

For the conductive pattern forming member 1 having the conductive pattern C1 shown in FIG. 3, the total light transmittance T of an unexposed portion was measured according to JIS K7361-1 using NDH-7000SP (manufactured by Nippon Denshoku Industries Co., Ltd.). Moreover, the total light transmittance $T_0$ of a portion where the composition C is not applied (i.e., the total light transmittance $T_0$ of the resin layer A alone) was measured similarly, and the decrease rate of T to $T_0$ was calculated. The residue was judged as good or poor according to the following criteria. The results are shown in Table 2.

The rate of decrease is 10% or less: Good
The rate of decrease is more than 10%: Poor

<Evaluation of Resistance to Ion Migration>

The conductive pattern forming member 1 having the conductive pattern C1 shown in FIG. 2 was placed in a high-temperature/high-humidity chamber at 85° C. and 85% RH, a voltage of DC 5 V was applied to the conductive pattern forming member 1 from a terminal, and a short circuit time required for a resistance to decrease by three orders rapidly was checked. The same evaluation was repeated for ten conductive pattern forming members 1, and the average thereof was considered as the value of resistance to ion migration. The results are shown in Table 2.

Examples 2 to 14

In the case where the transparent electrode layer B was formed of a silver fiber, a conductive pattern forming member under the conditions shown in Table 1 was produced in the same manner as in Example 1, and the same evaluations as those of Example 1 were carried out. The results are shown in Table 2.

<Formation of Transparent Electrode Layer B>

A 1.0 µm-thick silver fiber thin film was formed by applying an aqueous silver fiber dispersion (solid content: 0.2% by mass) to a resin layer A2 and then drying the dispersion at 100° C. for 5 minutes.

<Patterning of Silver Fiber Thin Film>

A photomask was put firmly on the silver fiber thin film and then the resin layer A2 and the silver fiber thin film were exposed to light in a dose of 200 mJ/cm² using an exposure apparatus equipped with an ultrahigh pressure mercury lamp. Furthermore, the resin layer A2 and the silver fiber thin film were exposed entirely to light in a dose of 200 mJ/cm² without use of a photomask, and then, spray development was performed for 30 seconds with a 1% by mass aqueous sodium carbonate solution at 30° C. Thus, a patterned transparent electrode layer B2 was formed on the resin layer A2.

Example 15

A conductive pattern forming member was produced in the same manner as in Example 1.

<Formation of OCA Layer D>

The OCA (d-1) was laminated onto the surfaces of the resin layer A1, the patterned transparent electrode layer B1, and the conductive pattern C1 at 80° C. and a pressing pressure of 0.5 MPa, and thus a laminated member 6 shown in FIG. 5 and a laminated member 7 shown in FIG. 6 were produced.

For the laminated members 6 and 7, the same evaluations as those of Example 1 were carried out. The results are shown in Table 2.

Examples 16 to 17

Conductive pattern forming members shown in Table 1 were produced by the same method as that of Example 15, and the same evaluations as those of Example 1 were carried out. The results are shown in Table 2.

Comparative Examples 1 to 3

Conductive pattern forming members of the conditions shown in Table 1 were produced by the same method as that of Example 1 or Example 2, and the same evaluations as those of Example 1 were carried out. The results are shown in Table 2.

It can be understood that in each of Examples 1 to 17, there was produced a conductive pattern forming member in which residues were suppressed sufficiently and which was excellent in resistance to ion migration.

TABLE 1

| | Layer A | | | | | Composition C | | | |
|---|---|---|---|---|---|---|---|---|---|
| | | Photopolymerization initiator | Monomer | | | | Photopolymerization initiator | Conductive particles (Silver particles) | |
| | Resin (a) | Component | Added amount per 100 parts by weight of resin (a) (part by weight) | Component | Added amount per 100 parts by weight of resin (a) (part by weight) | Transparent electrode layer B Conductive component | Resin (c) | Component | Added amount per 100 parts by weight of resin (c) (part by weight) | Proportion of particles having a particle diameter of 0.3 to 2.0 µm (%) | Content in solid component (% by mass) |
| Example 1 | a-1 | Ic-369 | 1 | MPD-A | 50 | ITO | c-1 | Ic-369 | 20 | 85 | 85 |
| Example 2 | a-1 | Ic-369 | 1 | MPD-A | 50 | Silver fiber | c-1 | Ic-369 | 20 | 85 | 85 |
| Example 3 | a-2 | Ic-369 | 1 | MPD-A | 50 | ITO | c-2 | OXE-01 | 10 | 85 | 85 |
| Example 4 | a-3 | OXE-01 | 1 | MPD-A | 50 | Silver fiber | c-2 | OXE-01 | 10 | 92 | 85 |
| Example 5 | a-4 | OXE-01 | 1 | — | — | Silver fiber | c-3 | Ic-369 | 20 | 87 | 85 |
| Example 6 | a-4 | Ic-369 | 1 | — | — | Silver fiber | c-4 | OXE-01 | 10 | 92 | 85 |
| Example 7 | a-2 | OXE-01 | 1 | MPD-A | 50 | Silver fiber | c-1 | Ic-369 | 20 | 87 | 85 |
| Example 8 | a-2 | OXE-01 | 1 | MPD-A | 50 | Silver fiber | c-5 | OXE-01 | 10 | 87 | 85 |
| Example 9 | a-4 | Ic-369 | 1 | — | — | ITO | c-5 | OXE-01 | 10 | 87 | 85 |

TABLE 1-continued

| | | | | | | | | | | | |
|---|---|---|---|---|---|---|---|---|---|---|---|
| Example 10 | a-4 | OXE-01 | 1 | — | — | Silver fiber | c-5 | OXE-01 | 10 | 92 | 85 |
| Example 11 | a-3 | OXE-01 | 1 | MPD-A | 50 | ITO | c-3 | OXE-01 | 10 | 65 | 85 |
| Example 12 | a-3 | OXE-01 | 1 | MPD-A | 50 | Silver fiber | c-3 | Ic-369 | 20 | 65 | 85 |
| Example 13 | a-1 | OXE-01 | 1 | MPD-A | 50 | ITO | c-4 | Ic-369 | 20 | 92 | 85 |
| Example 14 | a-2 | OXE-01 | 1 | MPD-A | 50 | Silver fiber | c-4 | OXE-01 | 10 | 92 | 85 |
| Example 15 | a-1 | Ic-369 | 1 | MPD-A | 50 | Silver fiber | c-1 | Ic-369 | 20 | 85 | 85 |
| Example 16 | a-1 | Ic-369 | 1 | MPD-A | 50 | Silver fiber | c-1 | Ic-369 | 20 | 85 | 85 |
| Example 17 | a-1 | Ic-369 | 1 | MPD-A | 50 | Silver fiber | c-1 | Ic-369 | 20 | 85 | 85 |
| Comparative Example 1 | a-1 | Ic-369 | 1 | MPD-A | 50 | ITO | c-2 | OXE-01 | 10 | 50 | 85 |
| Comparative Example 2 | a-3 | OXE-01 | 1 | MPD-A | 50 | Silver fiber | c-3 | OXE-01 | 10 | 40 | 85 |
| Comparative Example 3 | a-4 | OXE-01 | 1 | — | — | Silver fiber | c-4 | OXE-01 | 10 | 30 | 85 |

| | Composition C | | | | | | |
|---|---|---|---|---|---|---|---|
| | Alcoholic solvent | | Epoxy resin | | | | |
| | Component | Added amount per 100 parts by weight of resin (c) (part by weight) | Component | Added amount per 100 parts by weight of resin (c) (part by weight) | Temperature of drying step (° C.) | Pressure of developer (MPa) | OCA layer D Type |
| Example 1 | DEG | 50 | — | — | 70 | 0.1 | — |
| Example 2 | DEG | 50 | — | — | 70 | 0.1 | — |
| Example 3 | DEG | 50 | 828 | 20 | 60 | 0.1 | — |
| Example 4 | DEG | 50 | YX-8000 | 20 | 70 | 0.1 | — |
| Example 5 | DEG | 50 | YX-8000 | 20 | 70 | 0.1 | — |
| Example 6 | DEG | 50 | 828 | 20 | 60 | 0.075 | — |
| Example 7 | DEG | 50 | — | — | 60 | 0.15 | — |
| Example 8 | DEG | 50 | — | — | 70 | 0.1 | — |
| Example 9 | DEG | 50 | — | — | 80 | 0.1 | — |
| Example 10 | DEG | 50 | YX-8000 | 20 | 70 | 0.2 | — |
| Example 11 | DEG | 50 | YX-8000 | 20 | 70 | 0.2 | — |
| Example 12 | DEG | 50 | 828 | 20 | 70 | 0.1 | — |
| Example 13 | DEG | 50 | — | — | 70 | 0.1 | — |
| Example 14 | DEG | 50 | — | — | 70 | 0.1 | — |
| Example 15 | DEG | 50 | — | — | 70 | 0.1 | d-1 |
| Example 16 | DEG | 50 | — | — | 70 | 0.1 | d-2 |
| Example 17 | DEG | 50 | — | — | 70 | 0.1 | d-3 |
| Comparative Example 1 | DEG | 50 | — | — | 70 | 0.1 | — |
| Comparative Example 2 | DEG | 50 | — | — | 70 | 0.2 | — |
| Comparative Example 3 | DEG | 50 | — | — | 70 | 0.2 | — |

TABLE 2

| | Acid value SA of layer A [mg KOH/g] | Organic component acid value Sc of conductive pattern C [mg KOH/g] | SA − SC [mg KOH/g] | Residue | Resistance to migration |
|---|---|---|---|---|---|
| Example 1 | 98 | 55 | 43 | Good | 94 |
| Example 2 | 97 | 65 | 32 | Good | 67 |
| Example 3 | 139 | 13 | 126 | Good | 131 |
| Example 4 | 94 | 19 | 75 | Good | 129 |
| Example 5 | 106 | 21 | 85 | Good | 107 |
| Example 6 | 106 | 12 | 94 | Good | 124 |
| Example 7 | 140 | 61 | 79 | Good | 111 |
| Example 8 | 134 | 76 | 58 | Good | 89 |
| Example 9 | 102 | 70 | 32 | Good | 79 |
| Example 10 | 101 | 10 | 91 | Good | 128 |
| Example 11 | 95 | 8 | 87 | Good | 121 |
| Example 12 | 96 | 13 | 83 | Good | 129 |
| Example 13 | 94 | 66 | 28 | Good | 49 |
| Example 14 | 141 | 68 | 73 | Good | 99 |
| Example 15 | 97 | 65 | 32 | Good | 119 |
| Example 16 | 97 | 65 | 32 | Good | 135 |
| Example 17 | 97 | 65 | 32 | Good | 215 |
| Comparative Example 1 | 101 | 99 | 2 | Poor | 2 |
| Comparative Example 2 | 99 | 97 | 2 | Poor | 4 |
| Comparative Example 3 | 102 | 71 | 31 | Poor | 10 |

INDUSTRIAL APPLICABILITY

A conductive pattern forming member produced by the manufacturing method of the present invention can suitably be used as a constituent element of a touch panel.

DESCRIPTION OF REFERENCE SIGNS

: Transparent electrode layer B
2: Conductive pattern C
3: Layer A
4: Support
5: Terminal area
6: Exposure area of dry film C
7: Unexposed area of dry film C
8: Printed area of coating film C
9: OCA layer D

The invention claimed is:

1. A method for manufacturing a conductive pattern forming member, comprising:
    a coating step of applying, onto surfaces of a layer A formed of a resin (a) having a carboxyl group, and a transparent electrode layer B, the layers A and B being formed over a substrate, a composition C containing conductive particles and a resin (c) having a double bond and a carboxyl group to obtain a coating film C;
    a drying step of drying the coating film C to obtain a dry film C;
    an exposure step of exposing the dry film C to light to obtain an exposed film C;
    a developing step of developing the exposed film C to obtain a pattern C; and
    a curing step of curing the pattern C to obtain a conductive pattern C,
    wherein particles having a particle diameter of 0.3 to 2.0 μm account for 80% or more of the conductive particles.

2. The method for manufacturing a conductive pattern forming member according to claim 1, wherein particles having a particle diameter of 0.5 to 1.5 μm account for 80% or more of the conductive particles.

3. The method for manufacturing a conductive pattern forming member according to claim 1, wherein the composition C further contains a photopolymerization initiator.

4. The method for manufacturing a conductive pattern forming member according to claim 1, wherein the resin (c) having a double bond and a carboxyl group is an acrylic resin having an acid value of 50 to 250 mg KOH/g.

5. The method for manufacturing a conductive pattern forming member according to claim 1, wherein the transparent electrode layer B contains silver and the composition C contains silver particles as the conductive particles.

6. The method for manufacturing a conductive pattern forming member according to claim 5, wherein the silver contained in the transparent electrode layer B is in a fibrous form.

7. The method for manufacturing a conductive pattern forming member according to claim 1, wherein the composition C contains an alcoholic solvent having a boiling point of 200° C. or more.

8. The method for manufacturing a conductive pattern forming member according to claim 1, wherein the drying step is carried out at a temperature of 50 to 80° C.

9. The method for manufacturing a conductive pattern forming member according to claim 1, wherein the developing step is carried out at a development pressure of 0.02 to 0.2 MPa.

10. The method for manufacturing a conductive pattern forming member according to claim 1, wherein the composition C contains an epoxy resin.

11. The method for manufacturing a conductive pattern forming member according to claim 1, wherein a difference between an acid value SA of the layer A formed of the resin (a) having a carboxyl group and an organic component acid value SC of the conductive pattern C is 20 to 150 mg KOH/g.

12. A conductive pattern forming member produced by the method for manufacturing a conductive pattern forming member according to claim 1, wherein the conductive pattern C contains a compound having a urethane linkage.

13. A conductive pattern forming member produced by the method for manufacturing a conductive pattern forming member according to claim 1, wherein the conductive pattern C contains a compound having a cyclohexane skeleton.

14. A conductive pattern forming member produced by the method for manufacturing a conductive pattern forming member according to claim 1, wherein an optical clear adhesive layer D stacked on any of the layer A, the transparent electrode layer B and the conductive pattern C contains isobornyl skeleton.

15. A conductive pattern forming member produced by the method for manufacturing a conductive pattern forming member according to claim 1, wherein the layer D contains a benzotriazole-based compound.

* * * * *